United States Patent
Tomizawa et al.

(10) Patent No.: US 10,815,349 B2
(45) Date of Patent: Oct. 27, 2020

(54) RESIN COMPOSITION, PREPREG, RESIN SHEET, METAL FOIL-CLAD LAMINATE, AND PRINTED CIRCUIT BOARD

(71) Applicant: MITSUBISHI GAS CHEMICAL COMPANY, INC., Tokyo (JP)

(72) Inventors: Katsuya Tomizawa, Tokyo (JP); Tomoki Hamajima, Tokyo (JP); Shohei Yamaguchi, Tokyo (JP); Eisuke Shiga, Tokyo (JP); Meguru Ito, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 35 days.

(21) Appl. No.: 15/738,840

(22) PCT Filed: Jul. 4, 2016

(86) PCT No.: PCT/JP2016/069755
§ 371 (c)(1),
(2) Date: Dec. 21, 2017

(87) PCT Pub. No.: WO2017/006898
PCT Pub. Date: Jan. 12, 2017

(65) Prior Publication Data
US 2018/0179355 A1 Jun. 28, 2018

(30) Foreign Application Priority Data
Jul. 6, 2015 (JP) ................. 2015-135270

(51) Int. Cl.
| | | |
|---|---|---|
| C08J 5/24 | (2006.01) |
| C08L 63/00 | (2006.01) |
| C08K 5/3417 | (2006.01) |
| C08K 5/3445 | (2006.01) |
| C08K 5/3415 | (2006.01) |
| C08L 79/08 | (2006.01) |
| C09D 179/08 | (2006.01) |
| C08L 79/00 | (2006.01) |
| C08G 61/02 | (2006.01) |
| C08G 73/00 | (2006.01) |
| H01L 23/14 | (2006.01) |
| H01L 23/00 | (2006.01) |
| H05K 1/03 | (2006.01) |
| H01L 21/48 | (2006.01) |
| H05K 3/02 | (2006.01) |

(52) U.S. Cl.
CPC .............. *C08J 5/24* (2013.01); *C08G 61/02* (2013.01); *C08G 73/00* (2013.01); *C08K 5/3415* (2013.01); *C08K 5/3417* (2013.01); *C08K 5/3445* (2013.01); *C08L 63/00* (2013.01); *C08L 79/00* (2013.01); *C08L 79/085* (2013.01); *C09D 179/085* (2013.01); *H01L 23/145* (2013.01); *H01L 23/562* (2013.01); *H05K 1/0373* (2013.01); *C08J 2379/00* (2013.01); *C08J 2465/00* (2013.01); *H01L 21/4846* (2013.01); *H05K 3/022* (2013.01); *H05K 2201/0154* (2013.01); *H05K 2201/0162* (2013.01); *H05K 2201/068* (2013.01)

(58) Field of Classification Search
CPC . H05K 2201/0154; B32B 15/08; C08L 63/00; C08G 73/00; C08G 61/02
See application file for complete search history.

(56) References Cited

U.S. PATENT DOCUMENTS

| | | | |
|---|---|---|---|
| 9,902,851 B2 * | 2/2018 | Takahashi | ............... C08L 63/00 |
| 2007/0270568 A1 | 11/2007 | Ushiki et al. | |
| 2009/0017316 A1 | 1/2009 | Kato et al. | |
| 2011/0194261 A1 | 8/2011 | Tanaka et al. | |
| 2013/0101863 A1* | 4/2013 | Mabuchi | ............ C08G 59/5073 428/457 |
| 2014/0000948 A1 | 1/2014 | Nagai et al. | |
| 2014/0227924 A1* | 8/2014 | Nobukuni | ............ H05K 1/0353 442/60 |
| 2014/0374142 A1* | 12/2014 | Inoue | ...................... B32B 15/14 174/250 |
| 2015/0056454 A1* | 2/2015 | Takada | ........................ C08J 5/24 428/418 |
| 2015/0267047 A1 | 9/2015 | Takahashi et al. | |

FOREIGN PATENT DOCUMENTS

| | | |
|---|---|---|
| CN | 101103057 | 1/2008 |
| CN | 104736588 A | 6/2015 |
| EP | 1857478 A | 11/2007 |
| JP | H08-277265 A | 10/1996 |
| JP | 3173332 B2 | 6/2001 |
| JP | 2004-224817 | 8/2004 |

(Continued)

OTHER PUBLICATIONS

International Search Report issued with respect to Patent Application No. PCT/JP2016/069755, dated Aug. 23, 2016.

(Continued)

*Primary Examiner* — Gregory Listvoyb
(74) *Attorney, Agent, or Firm* — Greenblum & Bernstein, P.L.C.

(57) ABSTRACT

It is intended to provide a resin composition that suppresses the thermal expansion of a printed circuit board more than ever and also prevents the bleedout of substances from the printed circuit board, while maintaining a high glass transition temperature. The resin composition of the present invention contains an alkenyl-substituted nadimide, a maleimide compound, and an epoxy-modified cyclic silicone compound.

16 Claims, No Drawings

(56) References Cited

FOREIGN PATENT DOCUMENTS

| | | | |
|---|---|---|---|
| JP | 2009-035728 | A | 2/2009 |
| JP | 2011-178992 | A | 9/2011 |
| JP | 2012-197336 | A | 10/2012 |
| JP | 2012197336 | * | 10/2012 |
| JP | 2013-001807 | A | 1/2013 |
| JP | 2013-127022 | A | 6/2013 |
| JP | 2013-216884 | A | 10/2013 |
| JP | 2015-032638 | A | 2/2015 |
| JP | 2015-032639 | A | 2/2015 |
| WO | 2006/075654 | A1 | 7/2006 |
| WO | 2012/099134 | A1 | 7/2012 |
| WO | 2014/061812 | A1 | 4/2014 |

OTHER PUBLICATIONS

International Preliminary Report on Patentability issued with respect to Patent Application No. PCT/JP2016/069755, dated Aug. 23, 2016.

* cited by examiner

RESIN COMPOSITION, PREPREG, RESIN SHEET, METAL FOIL-CLAD LAMINATE, AND PRINTED CIRCUIT BOARD

TECHNICAL FIELD

The present invention relates to a resin composition, a prepreg, a resin sheet, a metal foil-clad laminate, and a printed circuit board.

BACKGROUND ART

The high integration or high-density packaging of each component for semiconductor packages has been increasingly accelerated in recent years as semiconductor packages widely used in electronics, communication devices, personal computers, etc. have been more highly functionalized or miniaturized. Along with this, the difference in the coefficient of thermal expansion between a semiconductor device and a printed circuit board for semiconductor plastic packages causes the undesired warpage of semiconductor plastic packages. Various approaches against this problem have been attempted.

One example of the approaches includes reduction in thermal expansion of insulating layers for use in printed circuit boards. This approach is to suppress the warpage by bringing the coefficient of thermal expansion of a printed circuit board closer to the coefficient of thermal expansion of a semiconductor device and is currently being actively addressed (see e.g., Patent Documents 1 to 3).

In addition to the reduction in thermal expansion of printed circuit boards, increase in the rigidity of laminates (high rigidity) or increase in the glass transition temperatures of laminates (high Tg) has been studied as an approach for suppressing the warpage of semiconductor plastic packages (see e.g., Patent Documents 4 and 5).

CITATION LIST

Patent Document

Patent Document 1: Japanese Patent Application Laid-Open No. 2013-216884
Patent Document 2: Japanese Patent No. 3173332
Patent Document 3: Japanese Patent Application Laid-Open No. 2009-035728
Patent Document 4: Japanese Patent Application Laid-Open No. 2013-001807
Patent Document 5: Japanese Patent Application Laid-Open No. 2011-178992

SUMMARY OF INVENTION

Technical Problem

Unfortunately, the reduction in thermal expansion of printed circuit boards by the conventional approaches described in Patent Literatures 1 to 3 has already approached their limits. Further reduction in thermal expansion is difficult.

For the purpose of achieving reduction in thermal expansion of printed circuit boards, it may be possible that a silicone resin is contained in a resin composition that serves as a raw material for printed circuit boards. However, the silicone resin contained in the resin composition causes bleedout of substances derived from the silicone resin from the resulting printed circuit board, because the silicone resin has low interaction with other components contained in the resin composition that serves as a raw material for the printed circuit board.

The present invention has been made in light of these circumstances, and an object of the present invention is to provide a resin composition that suppresses the thermal expansion of a printed circuit board more than ever and also prevents the bleedout of substances from the printed circuit board, while maintaining a high glass transition temperature, a prepreg, a resin sheet, a metal foil-clad laminate, and a printed circuit board.

Solution to Problem

The present inventors have conducted diligent studies to achieve the objects and consequently found that a resin composition that serves as a raw material for a printed circuit board contains a plurality of particular components, whereby all of increasing in Tg, reduction in thermal expansion of printed circuit board, and suppression of bleedout are achieved. On the basis of the finding, the present invention has been completed.

Specifically, the present invention is as described below.

[1]

A resin composition containing an alkenyl-substituted nadimide, a maleimide compound, and an epoxy-modified cyclic silicone compound.

[2]

The resin composition according to [1], wherein the resin composition contains an alicyclic epoxy-modified cyclic silicone compound as the epoxy-modified cyclic silicone compound.

[3]

The resin composition according to [1] or [2], wherein the resin composition contains, as the epoxy-modified cyclic silicone compound, a compound represented by the following formula (10):

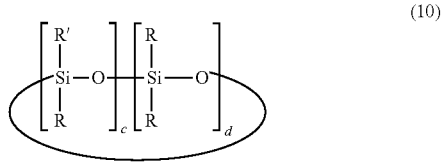

wherein R represents a hydrogen atom or a substituted or unsubstituted monovalent hydrocarbon group; R' represents an organic group having an epoxy group; a plurality of R are the same as or different from each other; when a plurality of R' are present, the plurality of R' are the same as or different from each other; c represents an integer of 3 to 5, d represents an integer of 0 to 2, the sum of c and d is an integer of 3 to 5; and each polymerization unit is optionally polymerized at random.

[4]

The resin composition according to [3], wherein the resin composition contains, as the epoxy-modified cyclic silicone compound, a compound represented by the following formula (10c):

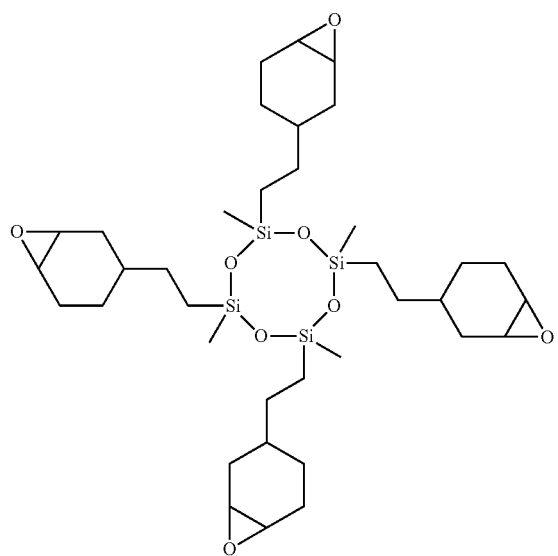

(10c)

[5]

The resin composition according to any one of [1] to [4], wherein the resin composition contains, as the alkenyl-substituted nadimide, a compound represented by the following formula (1):

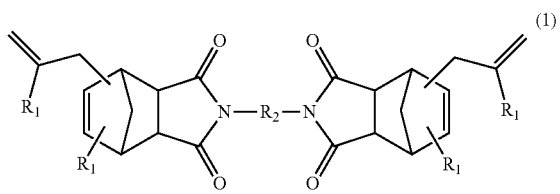

(1)

wherein each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by the following formula (2) or (3):

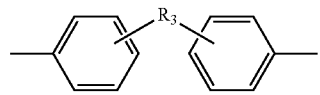

(2)

wherein $R_3$ represents a methylene group, an isopropylidene group, or a substituent represented by CO, O, S, or $SO_2$, and

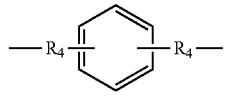

(3)

wherein each $R_4$ is independently selected and represents an alkylene group having 1 to 4 carbon atoms, or a cycloalkylene group having 5 to 8 carbon atoms.

[6]

The resin composition according to [5], wherein the resin composition contains, as the alkenyl-substituted nadimide, a compound represented by the following formula (4) and/or (5):

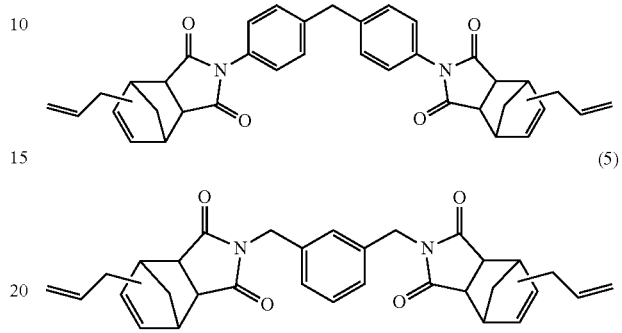

(4)

(5)

[7]

The resin composition according to any one of [1] to [6], wherein the resin composition contains, as the maleimide compound, at least one compound selected from the group consisting of bis(4-maleimidophenyl)methane, 2,2-bis{4-(4-maleimidophenoxy)-phenyl}propane, bis(3-ethyl-5-methyl-4-maleimidophenyl)methane, and a maleimide compound represented by the following formula (6):

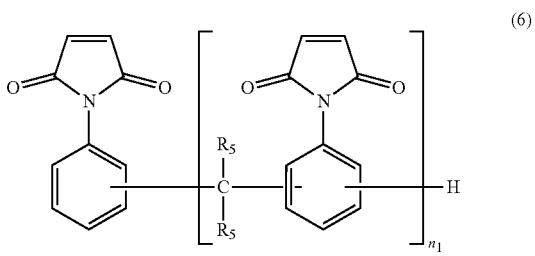

(6)

wherein each $R_5$ independently represents a hydrogen atom or a methyl group, and $n_1$ represents an integer of 1 or larger.

[8]

The resin composition according to any one of [1] to [7], further containing a cyanate ester compound.

[9]

The resin composition according to [8], wherein the resin composition contains, as the cyanate ester compound, a compound represented by the following formula (7) and/or (8):

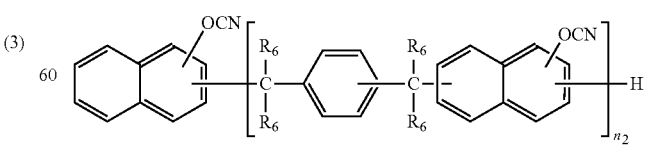

(7)

wherein each $R_6$ independently represents a hydrogen atom or a methyl group, and $n_2$ represents an integer of 1 or larger, and

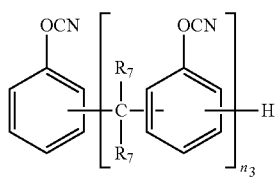

(8)

wherein each $R_7$ independently represents a hydrogen atom or a methyl group, and $n_3$ represents an integer of 1 or larger.

[10]

The resin composition according to any one of [1] to [9], further containing an epoxy compound other than the epoxy-modified cyclic silicone compound.

[11]

The resin composition according to any one of [1] to [10], wherein the epoxy-modified cyclic silicone compound is contained in an amount of 1 to 20 parts by mass based on 100 parts by mass in total of component(s) constituting a resin in the resin composition.

[12]

The resin composition according to any one of [1] to [11], further containing an inorganic filler.

[13]

The resin composition according to any one of [1] to [12], further containing an imidazole compound represented by the following formula (11):

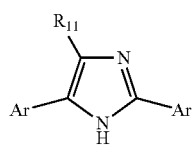

(11)

wherein each Ar independently represents a phenyl group, a naphthalene group, a biphenyl group, or an anthracene group, or a monovalent group derived therefrom modified with a hydroxy group, and $R_{11}$ represents a hydrogen atom, an alkyl group or a monovalent group derived therefrom modified with a hydroxy group, or an aryl group.

[14]

The resin composition according to [13], wherein the imidazole compound is 2,4,5-triphenylimidazole.

[15]

A prepreg including a base material and a resin composition according to any one of [1] to [14], the base material being impregnated or coated with the resin composition.

[16]

The prepreg according to [15], wherein the base material is at least one material selected from the group consisting of E glass cloth, T glass cloth, S glass cloth, Q glass cloth, and an organic fiber.

[17]

A resin sheet including a support and a resin composition according to any one of [1] to [14], the support being coated with the resin composition.

[18]

A laminate having one or more layers of at least one material selected from the group consisting of a prepreg according to [15] and [16] and a resin sheet according to [17], the laminate including a cured product of a resin composition contained in at least one material selected from the group consisting of the prepreg and the resin sheet.

[19]

A metal foil-clad laminate having at least one material selected from the group consisting of a prepreg according to [15] and [16] and a resin sheet according to [17], and a metal foil disposed on one side or both sides of at least one material selected from the group consisting of the prepreg and the resin sheet, the metal foil-clad laminate including a cured product of a resin composition contained in at least one material selected from the group consisting of the prepreg and the resin sheet.

[20]

A printed circuit board including an insulating layer and a conductor layer formed on the surface of the insulating layer, wherein the insulating layer contains a resin composition according to any one of [1] to [14].

Advantageous Effects of Invention

The present invention can provide a resin composition that can suppress the thermal expansion of a printed circuit board more than ever and also prevent the bleedout of substances from the printed circuit board, while maintaining a high glass transition temperature, a prepreg, a resin sheet, a metal foil-clad laminate, and a printed circuit board.

DESCRIPTION OF EMBODIMENTS

Hereinafter, an embodiment for carrying out the present invention (hereinafter, also referred to as the "present embodiment") will be described in detail. However, the present invention is not intended to be limited by the present embodiment described below. Various changes or modifications may be made in the present invention without departing from the spirit of the present invention.

The resin composition of the present embodiment contains an alkenyl-substituted nadimide, a maleimide compound, and an epoxy-modified cyclic silicone compound. This resin composition, which contains both of the alkenyl-substituted nadimide and the maleimide compound, has a high glass transition temperature (Tg) and rate of elastic modulus maintenance. In addition, the resin composition can suppress the thermal expansion of a printed circuit board, mainly because of containing the epoxy-modified cyclic silicone compound which exhibits low elastic characteristics. Among silicone compounds, the epoxy-modified cyclic silicone compound further contributes to a high degree to the suppression of bleedout when incorporated in a curing system. Therefore, the resin composition of the present embodiment can prevent bleedout from the printed circuit board, mainly because of this effect. However, possible factors are not limited thereto. In the present invention, the absence of Tg at a temperature of 400° C. or lower also means high Tg (increase in Tg). Also, the "rate of elastic modulus maintenance" means the ratio of flexural modulus at 250° C. to flexural modulus at 25° C. The excellent rate of elastic modulus maintenance (high rate of elastic modulus maintenance) means that, for example, the difference between the flexural modulus at 25° C. and the flexural modulus at 250° C. (elastic modulus under heat) is small. The rate of elastic modulus maintenance is specifically determined by the following method: the flexural modulus (bending strength) is measured at each of 25° C. and 250° C. using an autograph according to a method specified by JIS C 6481. From the measured flexural modulus at 25° C. (a)

and flexural modulus under heat at 250° C. (b), the rate of elastic modulus maintenance is calculated according to the following formula:

Rate of elastic modulus maintenance=(b)/(a)×100

The alkenyl-substituted nadimide used in the present embodiment is not particularly limited as long as the compound has one or more alkenyl-substituted nadimide groups in the molecule. Specific examples thereof include a compound represented by the following formula (1):

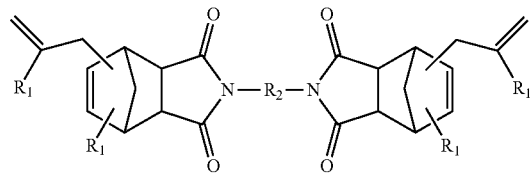
(1)

In the formula (1), each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by the following formula (2) or (3):

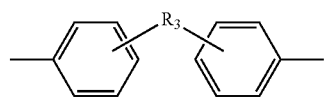
(2)

In the formula (2), $R_3$ represents a methylene group, an isopropylidene group, or a substituent represented by CO, O, S, or $SO_2$.

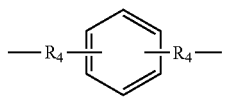
(3)

In the formula (3), each $R_4$ is independently selected and represents an alkylene group having 1 to 4 carbon atoms, or a cycloalkylene group having 5 to 8 carbon atoms.

A commercially available product can also be used as the alkenyl-substituted nadimide represented by the formula (1). Examples of the commercially available product include, but are not particularly limited to, a compound represented by the formula (4) set forth below (BANI-M (manufactured by Maruzen Petrochemical Co., Ltd.)), and a compound represented by the formula (5) set forth below (BANI-X (manufactured by Maruzen Petrochemical Co., Ltd.)). These compounds may be used singly or in combinations of two or more thereof.

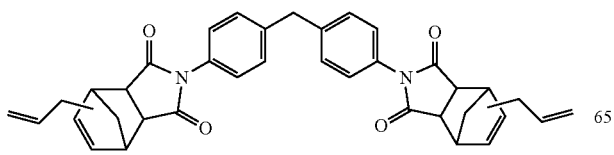
(4)

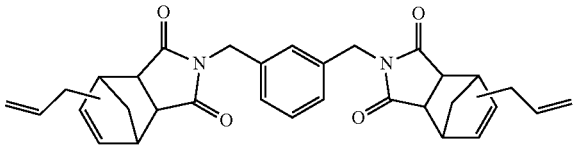
(5)

In the resin composition of the present embodiment, the content of the alkenyl-substituted nadimide is preferably determined according to the ratio of the number of functional group between an alkenyl group, one of its functional groups, and a maleimide group in the maleimide compound as mentioned later. The content of the alkenyl-substituted nadimide is preferably 10 to 60 parts by mass, more preferably 20 to 40 parts by mass, based on 100 parts by mass in total of component(s) constituting a resin (also including components that form resins by polymerization; the same holds true for the description below) in the resin composition. When the content of the alkenyl-substituted nadimide falls within such a range, the resulting printed circuit board can be excellent in moldability even with an inorganic filler, and be excellent in curability, elastic modulus under heat such as flexural modulus at, for example, 250° C. or flexural modulus at a solder reflow temperature, desmear resistance, and chemical resistance.

The maleimide compound used in the present embodiment is not particularly limited as long as the compound has one or more maleimide groups in the molecule. Specific examples thereof include N-phenylmaleimide, N-hydroxyphenylmaleimide, bis(4-maleimidophenyl)methane, 2,2-bis{4-(4-maleimidophenoxy)-phenyl}propane, bis(3,5-dimethyl-4-maleimidophenyl)methane, bis(3-ethyl-5-methyl-4-maleimidophenyl)methane, bis(3,5-diethyl-4-maleimidophenyl)methane, a maleimide compound represented by the formula (6) set forth below, prepolymers of these maleimide compounds, and prepolymers of the maleimide compounds and amine compounds. These compounds can be used singly or in a form of a suitable mixture of two or more thereof.

Among them, bis(4-maleimidophenyl)methane, 2,2-bis{4-(4-maleimidophenoxy)-phenyl}propane, bis(3-ethyl-5-methyl-4-maleimidophenyl)methane, or a maleimide compound represented by the following formula (6) is preferred, and a maleimide compound represented by the following formula (6) is particularly preferred. When the resin composition contains such a maleimide compound, the resulting cured product has a lower coefficient of thermal expansion and better heat resistance and can yield a printed circuit board having a higher glass transition temperature.

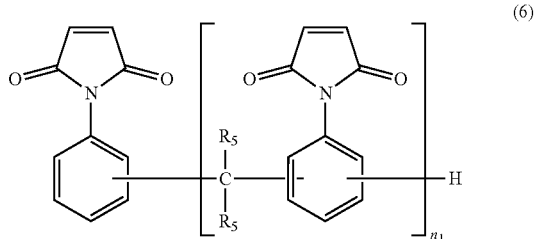
(6)

In the formula (6), each $R_5$ independently represents a hydrogen atom or a methyl group and is particularly preferably a hydrogen atom. In the formula, $n_1$ represents an integer of 1 or larger. The upper limit of $n_1$ is preferably 10, more preferably 7.

In the resin composition of the present embodiment, the contents of the alkenyl-substituted nadimide and the maleimide compound are preferably determined by the ratio between the numbers of their respective designated functional groups. In this context, the designated functional group of the alkenyl-substituted nadimide is alkenyl groups bonded to molecular ends, and the designated functional group of the maleimide compound is maleimide groups.

In the resin composition of the present embodiment, the content of the maleimide compound is preferably determined according to the ratio of the number of functional group between the number of alkenyl groups ($\alpha$) as a functional group in an optionally contained alkenyl-substituted nadimide and the number of maleimide groups ($\beta$) in the maleimide compound ([$\beta/\alpha$]). Specifically, the ratio of the number of maleimide groups ($\beta$) in the maleimide compound to the number of alkenyl groups ($\alpha$) in the alkenyl-substituted nadimide [$\beta/\alpha$] is preferably 0.9 to 4.3, more preferably 1.5 to 4.0, further preferably 1.5 to 3.0. When the functional group ratio [$\beta/\alpha$] falls within such a range, the resulting printed circuit board can be excellent in low thermal expansion, elastic modulus under heat, heat resistance, heat resistance after moisture absorption, desmear resistance, chemical resistance, and easy curability.

The epoxy-modified cyclic silicone compound used in the present embodiment is a silicone compound having siloxane bonds (Si—O—Si bonds) in the backbone, the siloxane bonds constituting a ring structure. Use of such an epoxy-modified cyclic silicone compound together with the alkenyl-substituted nadimide and the maleimide compound suppresses the thermal expansion of a printed circuit board more than ever and tends to be able to prevent the bleedout of substances from the printed circuit board.

Examples of the epoxy-modified cyclic silicone compound include: aliphatic epoxy-modified cyclic silicone compounds in which organic groups bonded to silicon have only an aliphatic hydrocarbon group as a hydrocarbon group; aromatic epoxy-modified cyclic silicone compounds in which organic groups bonded to silicon have an aromatic ring; and alicyclic epoxy-modified cyclic silicone compounds in which organic groups bonded to silicon have an alicyclic ring. These epoxy-modified cyclic silicone compounds are used singly or in combinations of two or more thereof. Among them, an alicyclic epoxy-modified cyclic silicone compound is preferred from in view of more effectively and reliably exhibiting the function effects of the present invention. Examples of the alicyclic epoxy-modified cyclic silicone compound include those mentioned later.

The epoxy-modified cyclic silicone compound is preferably, for example, a compound represented by the following formula (10) in which the siloxane bond constitutes a ring structure:

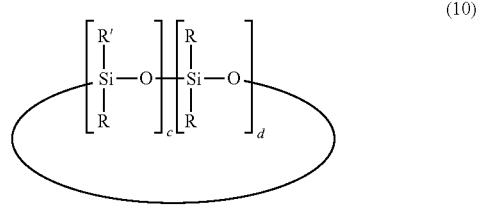

(10)

In this formula, R represents a hydrogen atom or a substituted or unsubstituted monovalent hydrocarbon group, and R' represents an organic group having an epoxy group. A plurality of R are the same as or different from each other. When a plurality of R' are present, the plurality of R' are the same as or different from each other. c represents an integer of 3 to 5 and is preferably 3 or 4, and d represents an integer of 0 to 2 and is preferably 0 or 1. The sum of c and d is an integer of 3 to 5 and is preferably 4. Each polymerization unit is optionally polymerized at random.

The epoxy-modified cyclic silicone compound represented by the formula (10) is more preferably an epoxy-modified cyclic silicone compound represented by the following formula (10a):

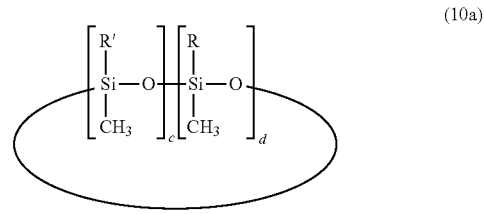

(10a)

In this formula, R, R', c, and d are as defined in the formula (10).

In these formulas, specific examples of the monovalent hydrocarbon group represented by R include substituted or unsubstituted aliphatic hydrocarbon groups having preferably 1 to 20 carbon atoms, more preferably 1 to 8 carbon atoms. More specific examples thereof include, but are not particularly limited to: alkyl groups such as a methyl group, an ethyl group, a propyl group, a butyl group, a hexyl group, and an octyl group; and groups in which some or all of the hydrogen atoms in these monovalent hydrocarbon groups are replaced with a glycidyl group (except for an epoxycyclohexyl group), a methacryl group, an acryl group, a mercapto group, or an amino group. Among them, R is preferably a methyl group, an ethyl group, or a hydrogen atom, more preferably a methyl group.

In these formulas, specific examples of the organic group having an epoxy group, represented by R' include substituted or unsubstituted hydrocarbon groups having an epoxy group. A hydrocarbon group having an epoxy group and an alicyclic ring is preferred in view of more effectively and reliably exhibiting the function effects of the present invention. The number of carbon atoms in R' is preferably 1 to 20, more preferably 1 to 12. More specific examples of R' include, but are not particularly limited to, a glycidoxypropyl group and a 3,4-epoxycyclohexylethyl group. Particularly, R' is preferably an organic group having a 3,4-epoxycyclohexyl group, more preferably an alkyl group having 1 to 4 carbon atoms in the principal chain and having a 3,4-epoxycyclohexyl group as a terminal substituent, further preferably a 2-(3,4-epoxycyclohexyl)ethyl group, because of small cure shrinkage that results in greater contribution to reduction in thermal expansion.

The epoxy-modified cyclic silicone compound represented by the formula (10a) is further preferably an epoxy-modified cyclic silicone compound represented by the following formula (10b):

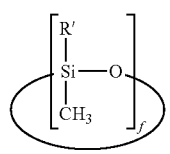

(10b)

In this formula, R' is as defined in the formula (10) and is particularly preferably a 2-(3,4-epoxycyclohexyl)ethyl group, and f represents an integer of 3 to 5 and is particularly preferably 4.

The epoxy-modified cyclic silicone compound mentioned above can be produced by a method known in the art or may be obtained as a commercially available product. For example, X-40-2670 (manufactured by Shin-Etsu Chemical Co., Ltd.), which is a compound represented by the following formula (10c), is preferably used as the commercially available product.

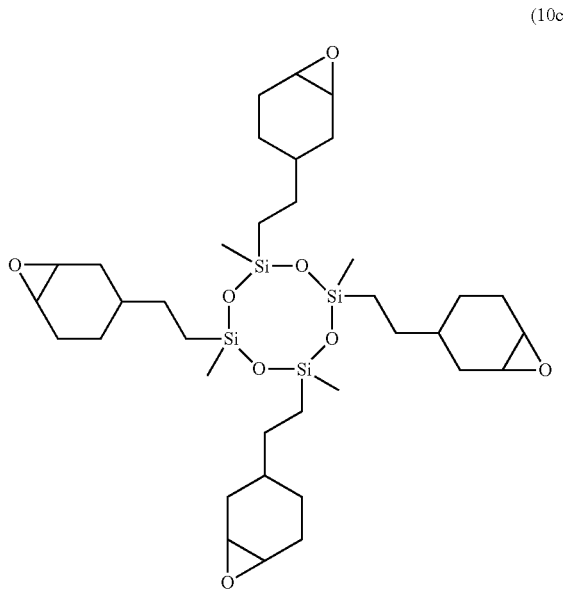

(10c)

In the resin composition of the present embodiment, the content of the epoxy-modified cyclic silicone compound is not particularly limited and is preferably 1 to 20 parts by mass, more preferably 5 to 20 parts by mass, based on 100 parts by mass in total of component(s) constituting a resin in the resin composition. When the content of the epoxy-modified cyclic silicone compound falls within the range mentioned above, the thermal expansion of a printed circuit board can be further suppressed while the warpage of the printed circuit board can be further prevented.

The resin composition of the present embodiment preferably further contains a cyanate ester compound in addition to each component mentioned above. By use of the cyanate ester compound, the epoxy-modified cyclic silicone compound can be incorporated more easily into a curing system, and thus, the bleedout can be further suppressed. The cyanate ester compound is used singly or in combinations of two or more thereof.

Examples of the type of the cyanate ester compound used in the present embodiment include, but are not particularly limited to, a naphthol aralkyl-based cyanate ester represented by the formula (7) set forth below, a novolac-based cyanate ester represented by the formula (8) set forth below, biphenyl aralkyl-based cyanate esters, bis(3,3-dimethyl-4-cyanatophenyl)methane, bis(4-cyanatophenyl)methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl) ether, bis(4-cyanatophenyl) thioether, bis(4-cyanatophenyl)sulfone, and 2,2-bis(4-cyanatophenyl) propane.

Among them, a naphthol aralkyl-based cyanate ester compound represented by the following formula (7), a novolac-based cyanate ester represented by the following formula (8), and a biphenyl aralkyl-based cyanate ester are particularly preferred because of excellent flame retardancy, high curability, and the low coefficient of thermal expansion of a cured product.

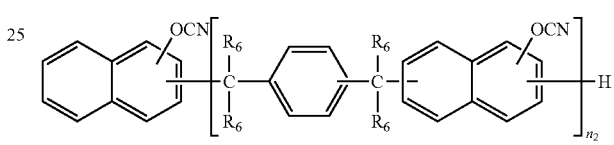

(7)

In this formula, each $R_6$ independently represents a hydrogen atom or a methyl group and is particularly preferably a hydrogen atom. In the formula, $n_2$ represents an integer of 1 or larger. The upper limit of $n_2$ is preferably 10, more preferably 6.

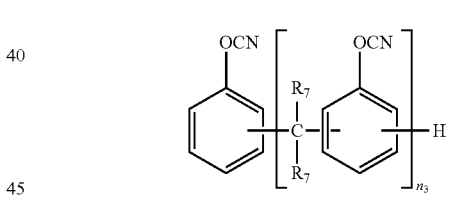

(8)

In this formula, each $R_7$ independently represents a hydrogen atom or a methyl group and is particularly preferably a hydrogen atom. In the formula, $n_3$ represents an integer of 1 or larger. The upper limit of $n_3$ is preferably 10, more preferably 7.

Methods for producing these cyanate ester compounds are not particularly limited, and the cyanate ester compound used in the present embodiment may be produced by any method existing as a cyanate ester synthesis method. As a specific example, the cyanate ester compound can be obtained by reacting a naphthol aralkyl-based phenol resin represented by the formula (9) set forth below with cyanogen halide in the presence of a basic compound in an inert organic solvent. An alternate method that may be adopted involves forming a salt of a similar naphthol aralkyl-based phenol resin and a basic compound in a solution containing water, followed by two-phase interfacial reaction with cyanogen halide for synthesis.

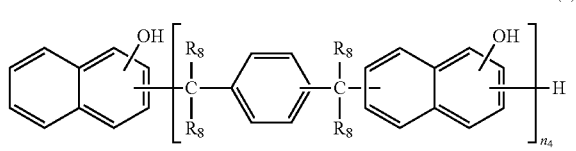

(9)

In this formula, each $R_8$ independently represents a hydrogen atom or a methyl group and is particularly preferably a hydrogen atom. In the formula, $n_4$ represents an integer of 1 or larger. The upper limit of $n_4$ is preferably 10, more preferably 6.

The naphthol aralkyl-based cyanate ester compound can be selected from those obtained by condensing cyanic acid with a naphthol aralkyl resin obtained through the reaction of a naphthol such as α-naphthol or β-naphthol with p-xylene glycol, α,α'-dimethoxy-p-xylene, 1,4-di(2-hydroxy-2-propyl)benzene, or the like.

In the resin composition of the present embodiment, the content of the cyanate ester compound is not particularly limited and is preferably 5 to 15 parts by mass, more preferably 5 to 10 parts by mass, based on 100 parts by mass in total of component(s) constituting a resin in the resin composition. The resin composition does not have to contain the cyanate ester compound for attaining the object of the present invention. When the resin composition contains the cyanate ester compound within the range mentioned above, the resulting printed circuit board can be excellent in other characteristics (e.g., moldability when an inorganic filler has been incorporated, elastic modulus under heat, desmear resistance, and chemical resistance).

The resin composition of the present embodiment may be supplemented with an additional resin, in addition to each component mentioned above, as long as the expected characteristics are not impaired. The type of the additional resin is not particularly limited as long as the resin has insulating properties. Examples thereof include resins such as epoxy compounds other than the epoxy-modified cyclic silicone compound, benzoxazine compounds, phenol resins, and thermoplastic resins. Appropriately combined use with these resins can confer characteristics such as metal adhesion and stress-relaxing properties.

The resin composition of the present embodiment may contain an epoxy compound other than the epoxy-modified cyclic silicone compound mentioned above (hereinafter, also referred to as an "additional epoxy compound"). Examples of the additional epoxy compound include, but are not particularly limited to, bisphenol A-based epoxy resins, bisphenol E-based epoxy resins, bisphenol F-based epoxy resins, bisphenol S-based epoxy resins, bisphenol A novolac-based epoxy resins, phenol novolac-based epoxy resins, cresol novolac-based epoxy resins, biphenyl-based epoxy resins, naphthalene-based epoxy resins, anthracene-based epoxy resins, trifunctional phenol-based epoxy resins, tetrafunctional phenol-based epoxy resins, glycidyl ester-based epoxy resins, phenol aralkyl-based epoxy resins, aralkyl novolac-based epoxy resins, biphenyl aralkyl-based epoxy resins, naphthol aralkyl-based epoxy resins, dicyclopentadiene-based epoxy resins, polyol-based epoxy resins, and alicyclic epoxy resins, and halides thereof. These additional epoxy compounds are used singly or in combinations of two or more thereof.

In the resin composition of the present embodiment, the ratio of the number of cyano groups (δ) in the cyanate ester compound to the number of epoxy groups (γ) in the epoxy compounds (epoxy-modified cyclic silicone compound and additional epoxy compound) [δ/γ] is preferably 0.1 to 0.7, more preferably 0.1 to 0.4. When the functional group ratio [δ/γ] falls within such a range, the resulting printed circuit board can be excellent in low thermal expansion characteristics.

The resin composition of the present embodiment preferably further contains an inorganic filler. The inorganic filler is not particularly limited as long as the inorganic filler has insulating properties. Examples thereof include silicas (e.g., natural silica, fused silica, amorphous silica, and hollow silica), alumina, aluminum nitride, boron nitride, boehmite, molybdenum oxide, titanium oxide, silicone rubber, hybrid silicone powder, zinc borate, zinc stannate, clay, kaolin, talc, fired clay, fired kaolin, fired talc, mica, short glass fiber (fine glass powders such as E glass and D glass), hollow glass, and spherical glass. These inorganic fillers are used singly or in combinations of two or more thereof. Among them, silica is preferred in view of achieving lower thermal expansion, and alumina or aluminum nitride is preferred in view of achieving higher thermal conductivity.

In the resin composition of the present embodiment, the content of the inorganic filler is not particularly limited and is preferably 50 to 500 parts by mass based on 100 parts by mass in total of component(s) constituting a resin in the resin composition in view of characteristics such as lower thermal expansion and higher thermal conductivity. Among others, the content of the inorganic filler is more preferably 100 to 300 parts by mass, further preferably 100 to 250 parts by mass.

The resin composition of the present embodiment preferably further contains an imidazole compound. The imidazole compound acts as a curing accelerator. The imidazole compound is not particularly limited and is preferably an imidazole compound represented by the following formula (11) in view of more effectively and reliably exhibiting the function effects of the present invention.

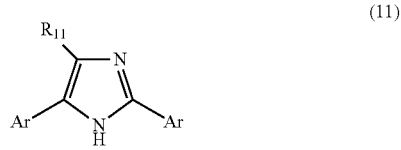

(11)

In this formula, each Ar independently represents a phenyl group, a naphthalene group, a biphenyl group, or an anthracene group, or a monovalent group thereof modified with a hydroxy group and is particularly preferably a phenyl group. $R_{11}$ represents a hydrogen atom, an alkyl group or a monovalent group thereof modified with a hydroxy group, or an aryl group. The aryl group is preferably a phenyl group, more preferably, both of the Ar group and the $R_{11}$ group are phenyl groups.

Examples of the imidazole compound include 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, 2-phenyl-4-methyl-5-hydroxymethylimidazole, 2,4,5-triphenylimidazole, and 2-phenyl-4-methylimidazole. Among them, 2,4,5-triphenylimidazole or 2-phenyl-4-methylimidazole is more preferred, and 2,4,5-triphenylimidazole is particularly preferred.

In the resin composition of the present embodiment, the content of the imidazole compound is not particularly limited and is preferably 0.1 to 10 parts by mass, more preferably 0.2 to 5 parts by mass, based on 100 parts by mass in total of component(s) constituting a resin in the resin composition. When the content of the imidazole compound falls within such a range, a printed circuit board can be obtained with the excellent storage stability of a prepreg and the excellent moldability of the prepreg upon processing into a metal-clad laminate.

The resin composition of the present embodiment may contain a silane coupling agent and/or a wetting dispersant in order to improve the dispersibility of the inorganic filler and the adhesion strength between the resin and the inorganic filler or glass cloth. The silane coupling agent is not particularly limited as long as the silane coupling agent is generally used in the surface treatment of inorganic substance. Specific examples of the silane coupling agent include: aminosilane derivatives such as γ-aminopropyltriethoxysilane and N-β-(aminoethyl)-γ-aminopropyltrimethoxysilane; epoxysilane derivatives such as γ-glycidoxypropyltrimethoxysilane; vinylsilane derivatives such as γ-methacryloxypropyltrimethoxysilane; cationic silane derivatives such as N-β-(N-vinylbenzylaminoethyl)-γ-aminopropyltrimethoxysilane hydrochloride; and styrylsilane derivatives such as p-styryltrimethoxysilane. These additional silane coupling agents are used singly or in combinations of two or more thereof. The wetting dispersant is not particularly limited as long as the wetting dispersant is used as a dispersion stabilizer for paint. Examples of commercially available products of the wetting dispersant include Disperbyk-110, 111, 118, 180, 161, 2009, BYK-W996, W9010, and W903 (all are product names) manufactured by BYK Japan K.K. These wetting dispersants are used singly or in combinations of two or more thereof.

The resin composition of the present embodiment may be used in combination with a curing accelerator other than the imidazole compound as long as expected characteristics are not impaired. Examples of the curing accelerator include: organic peroxides such as benzoyl peroxide, lauroyl peroxide, acetyl peroxide, p-chlorobenzoyl peroxide, and di-tert-butyl-di-perphthalate; azo compounds such as azobisnitrile; tertiary amines such as N,N-dimethylbenzylamine, N,N-dimethylaniline, N,N-dimethyltoluidine, 2-N-ethylanilinoethanol, tri-n-butylamine, pyridine, quinoline, N-methylmorpholine, triethanolamine, triethylenediamine, tetramethylbutanediamine, and N-methylpiperidine; phenols such as phenol, xylenol, cresol, resorcin, and catechol; organic metal salts such as lead naphthenate, lead stearate, zinc naphthenate, zinc octoate, tin oleate, dibutyl tin maleate, manganese naphthenate, cobalt naphthenate, and acetyl acetone iron; these organic metal salts dissolved in hydroxy group-containing compounds such as phenol and bisphenol; inorganic metal salts such as tin chloride, zinc chloride, and aluminum chloride; and dioctyl tin oxide and other organic tin compounds such as alkyl tin and alkyl tin oxide. These curing accelerators are used singly or in combinations of two or more thereof.

The resin composition of the present embodiment containing solid material such as the inorganic filler may further contain a surface conditioner for the purpose of, for example, improving the dispersibility of the solid material. The surface conditioner is not particularly limited as long as the surface conditioner is a surfactant conventionally contained in resin compositions. Examples thereof include polydimethylsiloxane derivatives and acrylic derivatives. Examples of commercially available products thereof include BYK-310, 330, and 346 manufactured by BYK Japan K.K. These surface conditioners are used singly or in combinations of two or more thereof.

The resin composition of the present embodiment may also contain a solvent, if necessary. For example, use of an organic solvent reduces viscosity during the preparation of the resin composition and thus improves handleability while enhancing the impregnation of glass cloth with the resin composition. The type of the solvent is not particularly limited as long as the solvent is capable of dissolving a portion or the whole of the resins in the resin composition. Specific examples thereof include, but are not particularly limited to: ketones such as acetone, methyl ethyl ketone, and methylcellosolve; aromatic hydrocarbons such as toluene and xylene; amides such as dimethylformamide; and propylene glycol monomethyl ether and its acetate. These solvents are used singly or in combinations of two or more thereof.

The resin composition of the present embodiment can be prepared according to a routine method. For example, a preferred method involves obtaining a resin composition homogeneously containing the components mentioned above. Specifically, for example, the components mentioned above can be sequentially added to the solvent and sufficiently stirred to readily prepare the resin composition of the present embodiment.

An organic solvent may be used, if necessary, in the preparation of the resin composition of the present embodiment. The type of the organic solvent is not particularly limited as long as the solvent is capable of dissolving the resins in the resin composition. Specific examples thereof are as listed above. Treatment (stirring, mixing, or kneading treatment, etc.) known in the art for uniformly dissolving or dispersing each component can be carried out in the preparation of the resin composition. In the case of using, for example, the inorganic filler, the inorganic filler can be uniformly dispersed by stirring and dispersion treatment using a stirring vessel equipped with a stirrer having an appropriate stirring ability. This enhances the dispersibility of the inorganic filler (D) in the resin composition. The stirring, mixing, or kneading treatment can be appropriately performed by using an apparatus known in the art such as an apparatus aimed at mixing such as a ball mill or a bead mill, or a revolution- or rotation-type mixing apparatus.

The insulating layer for printed circuit boards (hereinafter, also simply referred to as an "insulating layer") of the present embodiment contains the resin composition as an insulating layer. Examples of the form of the insulating layer for printed circuit boards include, but are not particularly limited to: a prepreg in which a well-known base material, such as glass fiber cloth, organic fiber cloth, glass fiber nonwoven fabric, or organic fiber nonwoven fabric, which is used in insulating layers for printed circuit boards, is impregnated with an arbitrary thermosetting resin, thermoplastic resin, or the like, and a metal foil-clad laminate prepared by laminating this prepreg with a metal foil; a resin sheet in the form of a metal foil or a film coated with any of these insulating resins; a sheet and a film of a resin including polyimide; and a metal foil-clad laminate prepared by laminating such a sheet or film with a metal foil. Specific examples of the resin sheet include, but are not particularly limited to, CRS (sheet obtained by coating a copper foil with a resin, followed by drying) and FRS (Ajinomoto ABF: sheet obtained by coating a film with a resin, followed by drying). Specific examples of the sheet and the film include, but are not particularly limited to, flexible boards obtained by the direct plating of a film or a resin and wiring.

In the present embodiment, such an approach is preferably used in combination with a technique conventionally used for reducing warpage, in view of the further suppression of warpage. Examples of such a technique include, but are not particularly limited to, conferring low thermal expansion or a high elastic modulus by the addition of an inorganic filler or a stress-relaxing component. These techniques may be used singly or in combinations of two or more thereof to more effectively reduce the warpage of semiconductor plastic packages.

The prepreg of the present embodiment is a prepreg including a base material and the resin composition, the base material being impregnated or coated with the resin composition. The method for producing the prepreg can be carried out in accordance with an ordinary method without particular limitations. For example, the base material can be impregnated or coated with the resin components according to the present embodiment, followed by semi-curing (conversion to B-staging) by heating or the like for 1 to 30 minutes in a drier of 100 to 200° C. to prepare the prepreg of the present embodiment.

The content of the resin composition (containing the inorganic filler) is not particularly limited and is preferably 30 to 90% by mass, more preferably 35 to 85% by mass, further preferably 40 to 80% by mass, based on the total mass of the prepreg. When the content of the resin composition falls within the range described above, moldability tends to be further improved.

The base material is not particularly limited and can be appropriately selected for use from various printed circuit board materials known in the art according to the intended use or performance. Specific examples thereof include, but are not particularly limited to: glass fibers such as E glass, D glass, S glass, Q glass, spherical glass, NE glass, L glass, and T glass; non-glass inorganic fibers such as quartz; wholly aromatic polyamides such as poly-p-phenylene-terephthalamide (Kevlar®, manufactured by Du Pont K.K.) and co-poly-p-phenylene/3,4'-oxydiphenylene/terephthalamide (Technora®, manufactured by Teijin Techno Products, Ltd.); polyesters such as 2,6-hydroxynaphthoic acid/p-hydroxybenzoic acid (Vectran®, manufactured by Kuraray Co., Ltd.) and Zexion® (manufactured by KB Seiren, Ltd.); and organic fibers such as poly-p-phenylene benzoxazole (Zylon®, manufactured by Toyobo Co., Ltd.) and polyimide. Among them, E glass, T glass, S glass, Q glass, or an organic fiber is preferred in view of a low coefficient of thermal expansion. These base materials may be used singly or in combinations of two or more thereof.

Examples of the form of the base material include, but are not particularly limited to, woven fabrics, nonwoven fabrics, lobings, chopped strand mats, and surfacing mats. The textures of the woven fabrics are not particularly limited, and, for example, plain weave, mat weave, and twill weave are known. The base material can be appropriately selected for use from these materials known in the art according to the intended use or performance. Such a base material subjected to opening treatment or a glass woven fabric surface-treated with a silane coupling agent or the like is preferably used. The base material is not particularly limited by its thickness and mass. Usually, the thickness of the base material of approximately 0.01 to 0.3 mm is preferably used. In particular, the base material is preferably a glass woven fabric having a thickness of 200 μm or smaller and a mass of 250 g/m$^2$ or smaller, more preferably a glass woven fabric made of E glass, S glass, and T glass fibers in view of strength and water absorbability.

The resin sheet of the present embodiment includes a support (sheet base material) and the resin composition, the sheet base material being coated with the resin composition. The resin composition is laminated on one side or both sides of the sheet base material. The resin sheet is used as an approach for thinning and can be produced, for example, by directly coating a support such as a metal foil or a film with a thermosetting resin (containing an inorganic filler) for use in prepregs, etc., followed by drying.

The sheet base material is not particularly limited, and any of various printed circuit board materials known in the art can be used. Examples thereof include polyimide films, polyamide films, polyester films, polyethylene terephthalate (PET) films, polybutylene terephthalate (PBT) films, polypropylene (PP) films, polyethylene (PE) films, aluminum foils, copper foils, and gold foils. Among them, an electrolytic copper foil or a PET film is preferred.

Examples of the coating method include a method of applying a solution of the resin composition of the present embodiment dissolved in a solvent onto the sheet base material using a bar coater, a die coater, a doctor blade, a Baker applicator, or the like.

The resin sheet is preferably a product obtained by coating the sheet base material (support) with the resin composition, followed by semi-curing (conversion to B-staging) the resin composition. Specific examples thereof include a method which involves coating the sheet base material such as a copper foil with the resin composition, followed by semi-curing the resin composition by a method such as heating for 1 to 60 minutes in a drier of 100 to 200° C. to produce the resin sheet. The amount of the resin composition applied to the support is preferably in the range of 1 to 300 μm in terms of the resin thickness of the resin sheet. The resin sheet of the present embodiment can be used as a buildup material for printed circuit boards.

The laminate of the present embodiment has one or more layers of at least one material selected from the group consisting of the aforementioned prepreg and resin sheet and includes a cured product of the resin composition contained in at least one material selected from the group consisting of the aforementioned prepreg and resin sheet. This laminate can be obtained by curing one or more layers of at least one material selected from the group consisting of the aforementioned prepreg and resin sheet. The metal foil-clad laminate of the present embodiment is a metal foil-clad laminate having at least one material selected from the group consisting of the aforementioned prepreg and resin sheet, and a metal foil disposed on one side or both sides of at least one material selected from the group consisting of the aforementioned prepreg and resin sheet, the metal foil-clad laminate including a cured product of the resin composition contained in at least one material selected from the group consisting of the aforementioned prepreg and resin sheet. This metal foil-clad laminate can be obtained by providing one or more layers of at least one material selected from the group consisting of the aforementioned prepreg and resin sheet, and disposing the metal foil on one side or both sides thereof, followed by laminate molding. More specifically, the metal foil-clad laminate can be produced by laminating one or more layers of the aforementioned prepreg and/or resin sheet, disposing the metal (e.g., copper or aluminum) foil on one side or both sides thereof if desired, and carrying out laminate molding of this structure according to the need. In this context, the metal foil used is not particularly limited as long as the metal foil can be used as a printed circuit board material. A copper foil known in the art such as a rolled copper foil or an electrolytic copper foil is preferred. The thickness of the metal foil is not particularly limited and is preferably 1 to 70 µm, more preferably 1.5 to 35 µm. The metal foil-clad laminate is not particularly limited by its molding method and molding conditions and can be molded by use of a general approach and conditions for laminates for printed circuit boards and multilayer boards. For example, a multiplaten press, a multiplaten vacuum press, a continuous molding machine, or an autoclave molding machine can be used in the molding of the metal foil-clad laminate. The metal foil-clad laminate is generally molded at a temperature of 100 to 300° C. and a pressure of 2 to 100 kgf/cm² in terms of surface pressure for a heating time in the range of 0.05 to 5 hours. If necessary, post curing may be further carried out at a temperature of 150 to 300° C. Alternatively, the laminate molding of the prepreg mentioned above may be carried out in combination with a separately prepared wiring board for an inner layer to obtain a multilayer board.

The printed circuit board of the present embodiment is a printed circuit board including an insulating layer and a conductor layer formed on the surface of the insulating layer, wherein the insulating layer contains the resin composition mentioned above. The conductor layer that serves as a circuit can be formed from the metal foil in the metal foil-clad laminate mentioned above or can be formed by electroless plating on the insulating layer. This printed circuit board has a high glass transition temperature of the insulating layer, can suppress bleedout, and further has a low coefficient of thermal expansion. Thus, the printed circuit board can be particularly effectively used as a printed circuit board for semiconductor packages required to have such performance.

Specifically, the printed circuit board of the present embodiment can be produced by, for example, the following method: first, the metal foil-clad laminate (copper-clad laminate, etc.) mentioned above is prepared. The surface of the metal foil-clad laminate is subjected to etching treatment for the formation of an inner layer circuit to prepare an inner layer substrate. The inner layer circuit surface of this inner layer substrate is subjected, if necessary, to surface treatment for enhancing adhesion strength. Subsequently, a required number of the prepreg mentioned above is laminated on the resulting inner layer circuit surface. A metal foil for an outer layer circuit is laterally laminated thereon, followed by integral molding under heat and pressure. In this way, a multilayer laminate is produced in which the insulating layer composed of the base material and a cured product of thermosetting resin composition is formed between the inner layer circuit and the metal foil for an outer layer circuit. Subsequently, this multilayer laminate is subjected to hole-making processing for making through-holes or via holes and then subjected to desmear treatment for removing smear, which is a residue of resins derived from the resin components contained in the cured product layer. Then, the inside walls of these holes are coated with a metal plating film for conducting the inner layer circuit and the metal foil for an outer layer circuit. The metal foil for an outer layer circuit is further subjected to etching treatment for the formation of the outer layer circuit to produce the printed circuit board.

For example, the prepreg mentioned above (base material impregnated with the resin composition mentioned above) or the resin composition layer of the metal foil-clad laminate (layer composed of the resin composition mentioned above) constitutes the insulating layer containing the resin composition mentioned above.

In the present embodiment, the ratio of flexural modulus under heat at 250° C. to flexural modulus at 25° C. (hereinafter, referred to as the "rate of elastic modulus maintenance") of the insulating layer is preferably 80 to 100% because the warpage of the printed circuit board during heating can be further suppressed. Examples of an approach for adjusting the rate of elastic modulus maintenance to 80 to 100% include, but are not particularly limited to, appropriately adjusting the type and content of each component of the resin composition for use in the insulating layer within the ranges described above.

Alternatively or additionally to this approach, the rate of elastic modulus maintenance may be adjusted to 80 to 100% by use of an existing method as long as it does not hinder the object of the present invention. Examples thereof include restricting molecular motion by the introduction of nano-filler, hybridizing nanosilica by a sol-gel method to a cross-linking point in a resin for use in the insulating layer, achieving high Tg of a resin itself for use in the insulating layer, and rendering the resin Tg-less in a region of 400° C. or lower.

When the metal foil-clad laminate is not used, the printed circuit board may be prepared by forming the conductor layer that serves as a circuit on the prepreg or the resin sheet. In this case, an electroless plating approach may be used for forming the conductor layer.

The printed circuit board of the present embodiment, which includes the insulating layer mentioned above, can be particularly effectively used as a printed circuit board for semiconductor plastic packages, because the printed circuit board can maintain the excellent elastic modulus even at a reflow temperature during semiconductor packaging, can suppress bleedout and thermal expansion, and can also prevent even bleedout.

EXAMPLES

Hereinafter, the present invention will be described in more detail with reference to Examples. However, the present invention is not intended to be limited by these Examples.

Synthesis Example 1

Synthesis of α-Naphthol Aralkyl-Based Cyanate Ester Resin

A reactor equipped with a thermometer, a stirrer, a dropping funnel, and a reflux condenser was cooled to 0 to 5° C. in advance using brine and charged with 7.47 g (0.122 mol) of cyanogen chloride, 9.75 g (0.0935 mol) of 35% hydrochloric acid, 76 mL of water, and 44 mL of methylene chloride. While the temperature and pH of this reactor were kept at −5 to +5° C. and 1 or lower, respectively, a solution containing 20 g (0.0935 mol) of an α-naphthol aralkyl-based phenol resin of the formula (9) wherein all of the $R_8$ were hydrogen atoms (SN485, OH group equivalent: 214 g/eq., softening point: 86° C., manufactured by Nippon Steel & Sumikin Chemical Co., Ltd.), and 14.16 g (0.14 mol) of triethylamine dissolved in 92 mL of methylene chloride was added dropwise over 1 hour through the dropping funnel with stirring. After the completion of the dropwise addition, 4.72 g (0.047 mol) of triethylamine was further added dropwise thereto over 15 minutes. After the completion of the dropwise addition, the mixture was stirred at the same temperature as above for 15 minutes. Then, the reaction solution was separated into organic and aqueous layers, and the organic layer was separated. The obtained organic layer was washed with 100 mL of water twice. Then, methylene chloride was distilled off under reduced pressure with an evaporator, and the residue was finally concentrated to dryness at 80° C. for 1 hour to obtain 23.5 g of a cyanate ester product of the α-naphthol aralkyl-based phenol resin (α-naphthol aralkyl-based cyanate ester resin, functional group equivalent: 261 g/eq.).

Example 1

5 parts by mass of the α-naphthol aralkyl-based cyanate ester resin obtained in Synthesis Example 1, 43 parts by mass of a novolac-based maleimide compound (BMI-2300, manufactured by Daiwa Fine Chemicals Co., Ltd., functional group equivalent: 186 g/eq.), 32 parts by mass of bisallylnadimide (BANI-M, manufactured by Maruzen Petrochemical Co., Ltd., functional group equivalent: 286 g/eq.), 10 parts by mass of a biphenyl aralkyl-based epoxy compound (NC-3000H, manufactured by Nippon Kayaku Co., Ltd., functional group equivalent: 290 g/eq.), and 10 parts by mass of an alicyclic epoxy-modified cyclic silicone compound (X-40-2670, manufactured by Shin-Etsu Chemical Co., Ltd., functional group equivalent: 185 g/eq.) were mixed with 200 parts by mass of slurry silica (SC-2050 MB, manufactured by Admatechs Co., Ltd.) and 0.5 parts by mass of 2,4,5-triphenylimidazole, and this mixture was diluted with methyl ethyl ketone to obtain varnish. An S glass woven fabric was impregnated and coated with this varnish, and dried by heating at 160° C. for 3 minutes to obtain a prepreg having a resin composition content of 45.0% by mass. In this respect, the ratio [β/α] was 2.07. In this context, the ratio [β/α] is represented by the following formula (the same holds true for the description below):

[β/α]=(Parts by mass of the maleimide compound/
Functional group equivalent of the maleimide
compound)/(Parts by mass of the alkenyl-substituted nadimide/Functional group equivalent of
the alkenyl-substituted nadimide)

Also, the ratio [δ/γ] was 0.22. In this context, the ratio [δ/γ] is represented by the following formula (the same holds true for the description below):

[δ/γ]=(Parts by mass of the cyanate ester compound/
Functional group equivalent of the cyanate ester
compound)/(Parts by mass of the epoxy compound/Functional group equivalent of the epoxy
compound)

The rate of elastic modulus maintenance was 86%. In this context, the rate of elastic modulus maintenance was determined as described below. First, copper foils were removed from a copper-clad laminate (50 mm×25 mm×0.8 mm) obtained as mentioned later. The flexural modulus of the resulting sample was measured at each of 25° C. and 250° C. using an autograph (AG-Xplus manufactured by Shimadzu Corp.) according to the method specified by JIS C 6481. From the flexural modulus at 25° C. (a) and the flexural modulus under heat at 250° C. (b) thus measured, the rate of elastic modulus maintenance was calculated according to the following formula (the same holds true for the description below):

Rate of Elastic Modulus Maintenance=(b)/(a)×100

Example 2

5 parts by mass of the α-naphthol aralkyl-based cyanate ester resin obtained in Synthesis Example 1, 45.4 parts by mass of a novolac-based maleimide compound (BMI-2300, manufactured by Daiwa Fine Chemicals Co., Ltd., functional group equivalent: 186 g/eq.), 34.5 parts by mass of bisallylnadimide (BANI-M, manufactured by Maruzen Petrochemical Co., Ltd., functional group equivalent: 286 g/eq.), 10 parts by mass of a biphenyl aralkyl-based epoxy compound (NC-3000H, manufactured by Nippon Kayaku Co., Ltd., functional group equivalent: 290 g/eq.), and 5 parts by mass of an alicyclic epoxy-modified cyclic silicone compound (X-40-2670, manufactured by Shin-Etsu Chemical Co., Ltd., functional group equivalent: 185 g/eq.) were mixed with 200 parts by mass of slurry silica (SC-2050 MB, manufactured by Admatechs Co., Ltd.) and 0.5 parts by mass of 2,4,5-triphenylimidazole, and this mixture was diluted with methyl ethyl ketone to obtain varnish. An S glass woven fabric was impregnated and coated with this varnish, and dried by heating at 160° C. for 3 minutes to obtain a prepreg having a resin composition content of 45.0% by mass. In this respect, the ratio [β/α] was 2.03, and the ratio [δ/γ] was 0.31. The rate of elastic modulus maintenance was 89%.

Example 3

49 parts by mass of a novolac-based maleimide compound (BMI-2300, manufactured by Daiwa Fine Chemicals Co., Ltd., functional group equivalent: 186 g/eq.), 36 parts by mass of bisallylnadimide (BANI-M, manufactured by Maruzen Petrochemical Co., Ltd., functional group equivalent: 286 g/eq.), 5 parts by mass of a biphenyl aralkyl-based epoxy compound (NC-3000H, manufactured by Nippon Kayaku Co., Ltd., functional group equivalent: 290 g/eq.), and 10 parts by mass of an alicyclic epoxy-modified cyclic silicone compound (X-40-2670, manufactured by Shin-Etsu Chemical Co., Ltd., functional group equivalent: 185 g/eq.) were mixed with 200 parts by mass of slurry silica (SC-2050 MB, manufactured by Admatechs Co., Ltd.) and 0.5 parts by mass of 2,4,5-triphenylimidazole, and this mixture was diluted with methyl ethyl ketone to obtain varnish. An S glass woven fabric was impregnated and coated with this varnish, and dried by heating at 160° C. for 3 minutes to obtain a prepreg having a resin composition content of 45.0% by mass. In this respect, the ratio [β/α] was 2.03. The rate of elastic modulus maintenance was 90%.

Example 4

5 parts by mass of the α-naphthol aralkyl-based cyanate ester resin obtained in Synthesis Example 1, 49 parts by mass of a novolac-based maleimide compound (BMI-2300, manufactured by Daiwa Fine Chemicals Co., Ltd., functional group equivalent: 186 g/eq.), 36 parts by mass of bisallylnadimide (BANI-M, manufactured by Maruzen Petrochemical Co., Ltd., functional group equivalent: 286 g/eq.), and 10 parts by mass of an alicyclic epoxy-modified cyclic silicone compound (X-40-2670, manufactured by Shin-Etsu Chemical Co., Ltd., functional group equivalent: 185 g/eq.) were mixed with 200 parts by mass of slurry silica (SC-2050 MB, manufactured by Admatechs Co., Ltd.) and 0.5 parts by mass of 2,4,5-triphenylimidazole, and this mixture was diluted with methyl ethyl ketone to obtain varnish. An S glass woven fabric was impregnated and coated with this varnish, and dried by heating at 160° C. for 3 minutes to obtain a prepreg having a resin composition content of 45.0% by mass. In this respect, the ratio [β/α] was 2.03, and the ratio [δ/γ] was 0.35. The rate of elastic modulus maintenance was 91%.

Comparative Example 1

5 parts by mass of the α-naphthol aralkyl-based cyanate ester resin obtained in Synthesis Example 1, 49 parts by mass of a novolac-based maleimide compound (BMI-2300, manufactured by Daiwa Fine Chemicals Co., Ltd., functional group equivalent: 186 g/eq.), 36 parts by mass of bisallylnadimide (BANI-M, manufactured by Maruzen Petrochemical Co., Ltd., functional group equivalent: 286 g/eq.), and 10 parts by mass of a biphenyl aralkyl-based epoxy compound (NC-3000H, manufactured by Nippon Kayaku Co., Ltd., functional group equivalent: 290 g/eq.) were mixed with 200 parts by mass of slurry silica (SC-2050 MB, manufactured by Admatechs Co., Ltd.) and 0.5 parts by mass of 2,4,5-triphenylimidazole, and this mixture was diluted with methyl ethyl ketone to obtain varnish. An S glass woven fabric was impregnated and coated with this varnish, and dried by heating at 160° C. for 3 minutes to obtain a prepreg having a resin composition content of 45.0% by mass. In this respect, the ratio [β/α] was 2.09, and the ratio [δ/γ] was 0.56. The rate of elastic modulus maintenance was 92%.

Comparative Example 2

5 parts by mass of the α-naphthol aralkyl-based cyanate ester resin obtained in Synthesis Example 1, 49 parts by mass of a novolac-based maleimide compound (BMI-2300, manufactured by Daiwa Fine Chemicals Co., Ltd., functional group equivalent: 186 g/eq.), 36 parts by mass of bisallylnadimide (BANI-M, manufactured by Maruzen Petrochemical Co., Ltd., functional group equivalent: 286 g/eq.), and 10 parts by mass of a polyoxynaphthylene-based epoxy compound (EXA-7311G4S, manufactured by DIC Corp., functional group equivalent: 190 g/eq.) were mixed with 200 parts by mass of slurry silica (SC-2050 MB, manufactured by Admatechs Co., Ltd.) and 0.5 parts by mass of 2,4,5-triphenylimidazole, and this mixture was diluted with methyl ethyl ketone to obtain varnish. An S glass woven fabric was impregnated and coated with this varnish, and dried by heating at 160° C. for 3 minutes to obtain a prepreg having a resin composition content of 45.0% by mass. In this respect, the ratio [β/α] was 2.09, and the ratio [δ/γ] was 0.36. The rate of elastic modulus maintenance was 92%.

Comparative Example 3

22.7 parts by mass of the α-naphthol aralkyl-based cyanate ester resin obtained in Synthesis Example 1, 27.6 parts by mass of a novolac-based maleimide compound (BMI-2300, manufactured by Daiwa Fine Chemicals Co., Ltd., functional group equivalent: 186 g/eq.), 29.7 parts by mass of a polyoxynaphthylene-based epoxy compound (HP-6000, manufactured by DIC Corp., functional group equivalent: 250 g/eq.), and 20 parts by mass of an alicyclic epoxy-modified cyclic silicone compound (X-40-2670, manufactured by Shin-Etsu Chemical Co., Ltd., functional group equivalent: 185 g/eq.) were mixed with 200 parts by mass of slurry silica (SC-2050 MB, manufactured by Admatechs Co., Ltd.) and 0.5 parts by mass of 2,4,5-triphenylimidazole, and this mixture was diluted with methyl ethyl ketone to obtain varnish. An S glass woven fabric was impregnated and coated with this varnish, and dried by heating at 160° C. for 3 minutes to obtain a prepreg having a resin composition content of 45.0% by mass. In this respect, the ratio [δ/γ] was 0.38. The rate of elastic modulus maintenance was 76%.

Comparative Example 4

21.7 parts by mass of the α-naphthol aralkyl-based cyanate ester resin obtained in Synthesis Example 1, 27.6 parts by mass of a novolac-based maleimide compound (BMI-2300, manufactured by Daiwa Fine Chemicals Co., Ltd., functional group equivalent: 186 g/eq.), 40.7 parts by mass of a polyoxynaphthylene-based epoxy compound (HP-6000, manufactured by DIC Corp., functional group equivalent: 250 g/eq.), and 10 parts by mass of an alicyclic epoxy-modified cyclic silicone compound (X-40-2670, manufactured by Shin-Etsu Chemical Co., Ltd., functional group equivalent: 185 g/eq.) were mixed with 200 parts by mass of slurry silica (SC-2050 MB, manufactured by Admatechs Co., Ltd.) and 0.5 parts by mass of 2,4,5-triphenylimidazole, and this mixture was diluted with methyl ethyl ketone to obtain varnish. An S glass woven fabric was impregnated and coated with this varnish, and dried by heating at 160° C. for 3 minutes to obtain a prepreg having a resin composition content of 45.0% by mass. In this respect, the ratio [δ/γ] was 0.38. The rate of elastic modulus maintenance was 72%.

Comparative Example 5

5 parts by mass of the α-naphthol aralkyl-based cyanate ester resin obtained in Synthesis Example 1, 51.5 parts by mass of a novolac-based maleimide compound (BMI-2300, manufactured by Daiwa Fine Chemicals Co., Ltd., functional group equivalent: 186 g/eq.), 38.5 parts by mass of bisallylnadimide (BANI-M, manufactured by Maruzen Petrochemical Co., Ltd., functional group equivalent: 286 g/eq.), and 5 parts by mass of an amine-modified silicone compound (X-22-161B, manufactured by Shin-Etsu Chemical Co., Ltd., functional group equivalent: 1500 g/eq.) were mixed with 200 parts by mass of slurry silica (SC-2050 MB, manufactured by Admatechs Co., Ltd.) and 0.5 parts by mass of 2,4,5-triphenylimidazole, and this mixture was diluted with methyl ethyl ketone to obtain varnish. An E glass woven fabric was impregnated and coated with this varnish, and dried by heating at 160° C. for 3 minutes to obtain a prepreg having a resin composition content of 45.0% by mass.

Comparative Example 6

5 parts by mass of the α-naphthol aralkyl-based cyanate ester resin obtained in Synthesis Example 1, 49 parts by mass of a novolac-based maleimide compound (BMI-2300, manufactured by Daiwa Fine Chemicals Co., Ltd., functional group equivalent: 186 g/eq.), 36 parts by mass of bisallylnadimide (BANI-M, manufactured by Maruzen Petrochemical Co., Ltd., functional group equivalent: 286 g/eq.), and 10 parts by mass of an amine-modified silicone compound (X-22-161B, manufactured by Shin-Etsu Chemical Co., Ltd., functional group equivalent: 1500 g/eq.) were mixed with 200 parts by mass of slurry silica (SC-2050 MB, manufactured by Admatechs Co., Ltd.) and 0.5 parts by mass of 2,4,5-triphenylimidazole, and this mixture was diluted with methyl ethyl ketone to obtain varnish. An S glass woven fabric was impregnated and coated with this varnish, and dried by heating at 160° C. for 3 minutes to obtain a prepreg having a resin composition content of 45.0% by mass.

[Preparation of Metal Foil-clad Laminate]

Electrolytic copper foils having a thickness of 12 μm (3EC-III, manufactured by Mitsui Mining & Smelting Co., Ltd.) were disposed on the upper and lower sides of 1 layer or 8 layers of the prepreg thus obtained, and laminate molding of the resultant was carried out at a pressure of 30 kgf/cm² and a temperature of 220° C. for 120 minutes to obtain a copper-clad laminate having an insulating layer thickness of 0.1 mm or 0.8 mm. The obtained copper-clad laminate was used to evaluate a glass transition temperature and the inside of the laminate. The results are shown in Table 1.

[Inside of Laminate]

The inside (insulating layer) of the copper-clad laminate thus obtained was visually observed. A sample observed to have bleedout was judged as "bleedout", and a sample observed to have no bleedout was judged as "good". When bleedout was found, none of the rate of elastic modulus maintenance, and the glass transition temperature and the coefficient of thermal expansion described below were measured.

[Glass Transition Temperature (Tg)]

A copper-clad laminate was obtained as mentioned above, and the copper foils were then removed from both sides thereof to obtain a sample. The dynamic viscoelasticity of the sample was measured under conditions involving a start temperature of 30° C., a finish temperature of 400° C., and a heating rate of 10° C./min using a dynamic viscoelastic measurement apparatus (manufactured by TA Instruments) according to JIS K7244-3 (JIS C 6481). The largest value of loss elastic modulus (E") obtained in this measurement was used as the glass transition temperature. The glass transition temperature serves as an index for heat resistance. In Table 1, a sample having a glass transition temperature in a region of 400° C. or lower was indicated by the value, and a sample having no glass transition temperature in a region of 400° C. or lower was indicated by "o".

[Coefficient of Thermal Expansion]

The coefficient of thermal expansion in the longitudinal direction of the glass cloth was measured for the insulating layer of the laminate according to TMA (thermomechanical analysis) specified by JIS C 6481 to determine the value. Specifically, after removal of the copper foils from both sides of the copper-clad laminate obtained as described above by etching, the resulting sample was heated from 40° C. to 340° C. at a rate of 10° C./min in a thermomechanical analysis apparatus (manufactured by TA Instruments) to measure the coefficient of linear thermal expansion (ppm/° C.) at from 60° C. to 120° C.

maintaining a high glass transition temperature. Therefore, the present invention is industrially applicable to fields such as printed circuit boards for use in semiconductor plastic packages.

The invention claimed is:

1. A resin composition comprising a resin consisting of an alkenyl-substituted nadimide, at least one maleimide compound, an epoxy-modified cyclic silicone compound, and one or more compounds selected from the group consisting of a cyanate ester compound and an epoxy compound other than the epoxy-modified cyclic silicone compound, and wherein a functional group ratio ($\beta/\alpha$) between the number of alkenyl groups ($\alpha$) in the alkenyl-substituted nadimide and the number of maleimide groups ($\beta$) in the maleimide compound is 2.03 to 4.3.

2. The resin composition according to claim 1, wherein the epoxy-modified cyclic silicone compound is an alicyclic epoxy-modified cyclic silicone compound.

3. The resin composition according to claim 1, wherein the epoxy-modified cyclic silicone compound is a compound represented by the following formula (10):

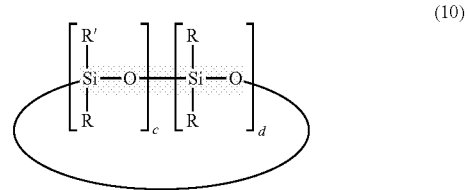

wherein R represents a hydrogen atom or a substituted or unsubstituted monovalent hydrocarbon group; R' represents an organic group having an epoxy group; a plurality of R are the same as or different from each other; when a plurality of R' are present, the plurality of

TABLE 1

|  | Example | | | | Comparative Example | | | | | |
| --- | --- | --- | --- | --- | --- | --- | --- | --- | --- | --- |
|  | 1 | 2 | 3 | 4 | 1 | 2 | 3 | 4 | 5 | 6 |
| Inside of laminate | Good | Good | Good | Good | Good | Good | Good | Good | Bleedout | Bleedout |
| Glass transition temperature (° C.) | o | o | o | o | o | o | 300 | 290 | — | — |
| Coefficient of thermal expansion (ppm/° C.) | 2.4 | 2.9 | 2.6 | 2.0 | 4.0 | 3.8 | 2.9 | 3.8 | — | — |

The present application is based on Japanese Patent Application No. 2015-135270 filed on Jul. 6, 2015, the contents of which are incorporated herein by reference.

INDUSTRIAL APPLICABILITY

The present invention can suppress the thermal expansion of a printed circuit board more than ever and also prevent the bleedout of substances from the printed circuit board, while R' are the same as or different from each other; c represents an integer of 3 to 5, d represents an integer of 0 to 2, the sum of c and d is an integer of 3 to 5; and each polymerization unit is optionally polymerized at random.

4. The resin composition according to claim 3, wherein the resin the epoxy-modified cyclic silicone compound is a compound represented by the following formula (10c):

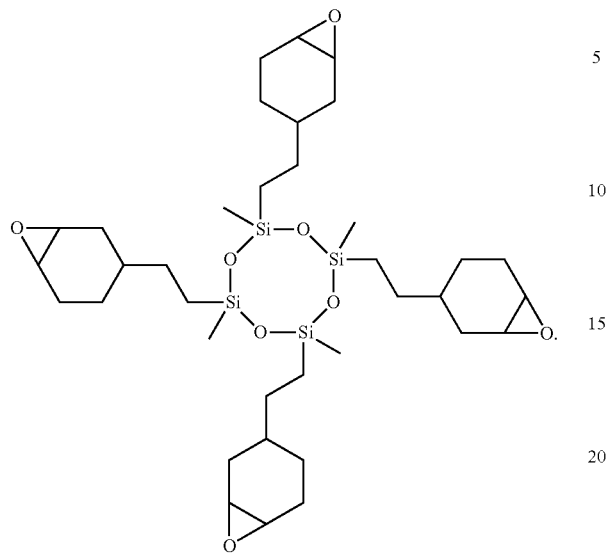

(10c)

5. The resin composition according to claim 1, wherein the alkenyl-substituted nadimide is a compound represented by the following formula (1):

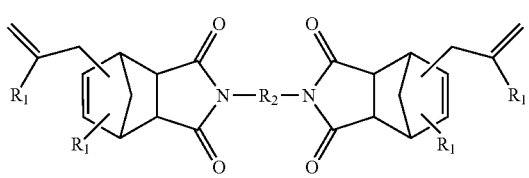

(1)

wherein each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by the following formula (2) or (3):

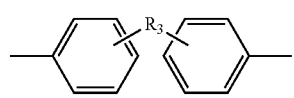

(2)

wherein $R_3$ represents a methylene group, an isopropylidene group, or a substituent represented by CO, O, S, or $SO_2$, and

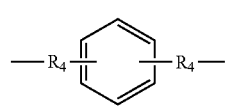

(3)

wherein each $R_4$ is independently selected and represents an alkylene group having 1 to 4 carbon atoms, or a cycloalkylene group having 5 to 8 carbon atoms.

6. The resin composition according to claim 5, wherein the alkenyl-substituted nadimide is a compound represented by the following formula (4) and/or (5):

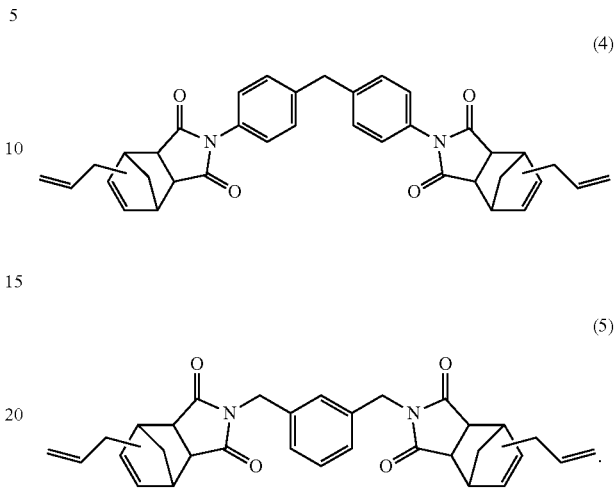

(4)

(5)

7. The resin composition according to claim 1, wherein the maleimide compound is at least one compound selected from the group consisting of bis(4-maleimidophenyl)methane, 2,2-bis{4-(4-maleimidophenoxy)-phenyl}propane, bis(3-ethyl-5-methyl-4-maleimidophenyl)methane, and a maleimide compound represented by the following formula (6):

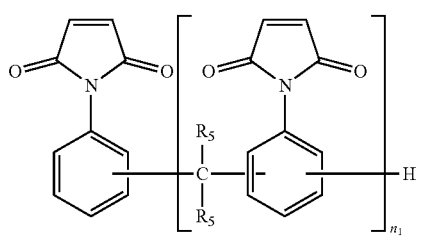

(6)

wherein each $R_5$ independently represents a hydrogen atom or a methyl group, and $n_1$ represents an integer of 1 or larger.

8. The resin composition according to claim 1, including the cyanate ester compound.

9. The resin composition according to claim 8, wherein the cyanate ester compound is a compound represented by the following formula (7) and/or (8):

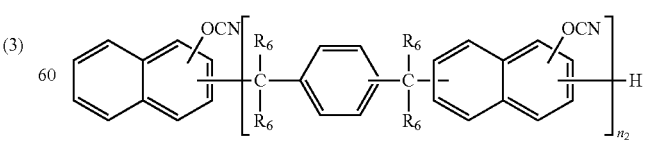

(7)

wherein each $R_6$ independently represents a hydrogen atom or a methyl group, and $n_2$ represents an integer of 1 or larger, and (8)

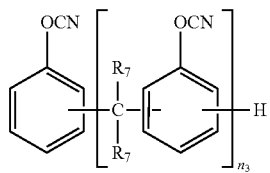

wherein each $R_7$ independently represents a hydrogen atom or a methyl group, and $n_3$ represents an integer of 1 or larger.

10. The resin composition according to claim 1, including the epoxy compound other than the epoxy-modified cyclic silicone compound.

11. The resin composition according to claim 1, wherein the epoxy-modified cyclic silicone compound is contained in an amount of 1 to 20 parts by mass based on 100 parts by mass in total of component(s) constituting a resin in the resin composition.

12. The resin composition according to claim 1, further comprising an inorganic filler.

13. The resin composition according to claim 1, further comprising an imidazole compound represented by the following formula (11):

(11)

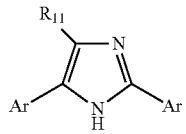

wherein each Ar independently represents a phenyl group, a naphthalene group, a biphenyl group, or an anthracene group, or a monovalent group derived therefrom modified with a hydroxy group, and $R_{11}$ represents a hydrogen atom, an alkyl group or a monovalent group derived therefrom modified with a hydroxy group, or an aryl group.

14. The resin composition according to claim 13, wherein the imidazole compound is 2,4,5-triphenylimidazole.

15. A metal foil-clad laminate having at least one material selected from the group consisting of a prepreg comprising a base material and a resin composition according to claim 1, the base material being impregnated or coated with the resin composition, and a resin sheet comprising a support and the resin composition, the support being coated with the resin composition, and a metal foil disposed on one side or both sides of at least one material selected from the group consisting of the prepreg and the resin sheet, the metal foil-clad laminate comprising a cured product of a resin composition contained in at least one material selected from the group consisting of the prepreg and the resin sheet.

16. A printed circuit board comprising an insulating layer and a conductor layer formed on the surface of the insulating layer, wherein the insulating layer comprises a resin composition according to claim 1.

* * * * *

UNITED STATES PATENT AND TRADEMARK OFFICE
CERTIFICATE OF CORRECTION

PATENT NO. : 10,815,349 B2
APPLICATION NO. : 15/738840
DATED : October 27, 2020
INVENTOR(S) : K. Tomizawa et al.

It is certified that error appears in the above-identified patent and that said Letters Patent is hereby corrected as shown below:

Column 26, Lines 65, 66 (Claim 4, Lines 1, 2) please change "wherein the resin the epoxy-modified cyclic silicone compound" to -- wherein the epoxy-modified cyclic silicone compound --

Signed and Sealed this
Twenty-seventh Day of April, 2021

Drew Hirshfeld
*Performing the Functions and Duties of the*
*Under Secretary of Commerce for Intellectual Property and*
*Director of the United States Patent and Trademark Office*